US009927084B2

(12) United States Patent
Marchesin et al.

(10) Patent No.: US 9,927,084 B2
(45) Date of Patent: Mar. 27, 2018

(54) VEHICLE LIGHT AND RELATED MANUFACTURING METHOD

(71) Applicant: AUTOMOTIVE LIGHTING ITALIA S.p.A., Turin (IT)

(72) Inventors: Stefano Marchesin, Turin (IT); Franco Marcori, Turin (IT); Igor Di Vora, Turin (IT); Michele Antonipieri, Turin (IT)

(73) Assignee: AUTOMOTIVE LIGHTING ITALIA S.p.A., Turin (IT)

( * ) Notice: Subject to any disclaimer, the term of this patent is extended or adjusted under 35 U.S.C. 154(b) by 128 days.

(21) Appl. No.: 15/182,800

(22) Filed: Jun. 15, 2016

(65) Prior Publication Data
US 2016/0369964 A1 Dec. 22, 2016

(30) Foreign Application Priority Data

Jun. 16, 2015 (IT) ......................... 102015000024373

(51) Int. Cl.
*F21S 8/10* (2006.01)
*B60Q 1/26* (2006.01)
(Continued)

(52) U.S. Cl.
CPC .......... *F21S 48/1208* (2013.01); *B26D 7/015* (2013.01); *B26D 7/08* (2013.01);
(Continued)

(58) Field of Classification Search
CPC ............... F21S 48/1208; F21S 48/1159; F21S 48/1305; F21S 48/211; F21S 48/212;
(Continued)

(56) References Cited

U.S. PATENT DOCUMENTS

2005/0225999 A1* 10/2005 Bucher ................. F21S 48/145
362/539
2008/0037267 A1* 2/2008 Converse ............ F21S 48/1394
362/510
(Continued)

FOREIGN PATENT DOCUMENTS

DE 102012007227 A1 11/2012
EP 2650590 A2 10/2013
(Continued)

*Primary Examiner* — Mary Ellen Bowman
(74) *Attorney, Agent, or Firm* — Howard & Howard Attorneys PLLC (57) ABSTRACT

A vehicle light comprising a container body and a lenticular body. The light comprises a substrate that supports a main light source that is embedded in a cover layer suitable to allow the diffusion inside it of the main light beam. The cover layer is disposed on the side opposite to the lenticular body with respect to the substrate. The substrate comprises at least one transparent portion to the light beam suitable to transmit the main light beam towards the lenticular body and, through this, to the outside of the vehicle light, wherein the substrate comprises at least one opaque portion to the main light beam, adjacent to said transparent portion in order to allow the passage of the main light beam exclusively at said transparent portion. The transparent portion defines a main light pattern of the vehicle light.

18 Claims, 6 Drawing Sheets

(51) Int. Cl.
  *F21V 8/00* (2006.01)
  *B26D 7/08* (2006.01)
  *B26D 7/10* (2006.01)
  *B26D 7/20* (2006.01)
  *B26D 7/01* (2006.01)
  *H01L 25/075* (2006.01)
  *F21W 101/14* (2006.01)
  *F21Y 115/10* (2016.01)
  *F21Y 107/10* (2016.01)

(52) U.S. Cl.
  CPC ............... *B26D 7/10* (2013.01); *B26D 7/20* (2013.01); *B60Q 1/2607* (2013.01); *F21S 48/1159* (2013.01); *F21S 48/1305* (2013.01); *F21S 48/211* (2013.01); *F21S 48/212* (2013.01); *F21S 48/215* (2013.01); *F21S 48/218* (2013.01); *F21S 48/2206* (2013.01); *F21S 48/2243* (2013.01); *F21S 48/2268* (2013.01); *F21S 48/2281* (2013.01); *F21S 48/232* (2013.01); *F21S 48/234* (2013.01); *F21S 48/238* (2013.01); *G02B 6/0043* (2013.01); *G02B 6/0073* (2013.01); *H01L 25/0753* (2013.01); *F21W 2101/14* (2013.01); *F21Y 2107/10* (2016.08); *F21Y 2115/10* (2016.08)

(58) Field of Classification Search
  CPC .... F21S 48/215; F21S 48/218; F21S 48/2206; F21S 48/2243; F21S 48/2268; F21S 48/2281; F21S 48/232; F21S 48/234; F21S 48/238; G02B 6/0043; G02B 6/0073; H01L 25/0753; B26D 7/08; B26D 7/10; B26D 7/20; B60Q 1/2607
  See application file for complete search history.

(56) References Cited

U.S. PATENT DOCUMENTS

2014/0211449 A1* 7/2014 Nomura ............... B60Q 1/302
  362/84
2016/0040847 A1  2/2016 Ikuta et al.

FOREIGN PATENT DOCUMENTS

| EP | 2696135 A2 | 2/2014 |
| JP | 2014235817 A | 12/2014 |
| WO | 2014156668 A1 | 10/2014 |

* cited by examiner

FIG.6

VEHICLE LIGHT AND RELATED MANUFACTURING METHOD

CROSS-REFERENCE TO RELATED APPLICATIONS

The present application claims priority to and all the benefits of Italian Patent Application No. 102015000024373, filed on Jun. 16, 2015, which is hereby expressly incorporated herein by reference in its entirety.

BACKGROUND OF THE INVENTION

1. Field of the Invention

This invention relates to a vehicle light and a related manufacturing method.

2. Description of the Related Art

The term vehicle light means both a rear vehicle tail light or a front vehicle headlight, the latter also called projector, or headlamp.

As is known, a vehicle light is a lighting and/or signalling device of a vehicle comprising at least one external light of the vehicle having a function of lighting and/or signalling towards the outside of a vehicle such as, for example, a position light, a turn signal light, a brake light, a rear fog light, a back-up light, a low beam, a high beam and the like.

The vehicle light, in its most simple abstraction, comprises a container body, a lenticular body and at least one light source.

The lenticular body is placed so as to close a mouth of the container body so as to form a housing chamber. Inside the housing chamber is arranged the light source, which can be directed so as to emit light towards the lenticular body, when electrically powered.

The method of making a vehicle light, once the various components are assembled, must provide for the fixing and sealing of the lenticular body on the container body.

In the art, there is an increasingly felt need to use the vehicle light not only as a tool to meet homologation needs, in order to obtain light beams that must meet particular photometric requirements, but also as a specific tool for designing the vehicle on which the light is applied.

Therefore, the luminous pattern emitted by the light has not only a signalling and/or illumination function, but also that of creating a precise desired luminous effect. This luminous effect or pattern is increasingly the leitmotif of some car manufacturers that, also thanks to the optical component of the vehicle lights, intend differentiate themselves from their competitors.

Moreover, a need is felt to obtain optical groups able to achieve several lighting functions (such as position lights, brake lights, depth lights, back-up lights, turn signals, side markers, etc.) limiting the overall dimensions and thus the overall weight of the light itself.

SUMMARY OF THE INVENTION

The disadvantages in the related art are overcome in the vehicle light of the present invention. The vehicle light includes a container body and a lenticular body at least partially counter-shaped to each other. The container body delimits a containment seat that houses at least one main light source and the lenticular body is applied to the core container body so as to close the container seat. The lenticular body is made in transparent or semi-transparent or translucent material to a main light beam emitted by the main light source. The vehicle light further includes a substrate that supports the main light source on the side opposite the lenticular body. The substrate includes an outer face facing the lenticular body and an inner face, opposite to the outer face. The main light source is associated on the side of the interface of the substrate. The main light source is embedded in a cover layer, in plastic, suitable to permit the diffusion of the main light beam inside it. The cover layer is placed opposite the lenticular body with respect to the substrate. The substrate includes at least one portion transparent to the light beam suitable to transmit the main light beam towards the lenticular body and, through this, outside the vehicle light. The substrate includes at least one opaque portion to the main light beam, adjacent to the transparent portion in order to allow the passage of the main light beam exclusively at the transparent portion. The transparent portion defines a main light pattern of the vehicle light.

In addition, the present invention is also directed toward a method of manufacturing an automotive headlight including the steps of preparing a container body and a lenticular body at least partially counter-shaped to each other, wherein the container body delimits a containment seat which houses at least one main light source and the lenticular body is applied to the container body so as to close the containment seat, and wherein the lenticular body is made in transparent material to a main light beam emitted by the main light source. The method further includes a step of preparing a substrate that supports the main light source, on the side opposite the lenticular body, and wherein the substrate includes an outer face facing the lenticular body and an inner face, opposite the outer face, and wherein the main light source is associated on the side of the inner face of the substrate. The main light source is embedded in a cover layer in plastic that is suitable to permit the diffusion of the main light beam inside it and the cover layer is placed opposite the lenticular body with respect to the substrate. The substrate comprises at least one portion transparent to the light beam suitable to transmit the main light beam towards the lenticular body and, through this, outside the vehicle light. The substrate further includes at least one opaque portion to the main light beam, adjacent to the transparent portion in order to allow the passage of the main light beam exclusively at the transparent portion and wherein the transparent portion defines a main light pattern of the vehicle.

Other objects, features and advantages of the present invention will be readily appreciated as the same becomes better understood after reading the subsequent description taken in connection with the accompanying drawings.

BRIEF DESCRIPTION OF THE DRAWINGS

The elements, or parts of elements, in common between the embodiments described below will be indicated with the same reference numbers.

DETAILED DESCRIPTION OF THE INVENTION

With reference to the above figures, reference number 4 indicates a vehicle light in its entirety, to which the discussion that follows will refer without, for this reason, losing generality.

As mentioned above, the term vehicle light means both a rear vehicle tail light or a front vehicle headlight, the latter also called projector, or headlamp.

As is known, a vehicle light comprises at least one external light of the vehicle having a function of lighting and/or signalling, such as, for example, a position light, which can be a front, rear or side position light, a turn signal light, a brake light, a rear fog light, a low beam, a high beam and the like.

The vehicle light 4 comprises a container body 8, usually made of polymeric material, which typically allows fixing the vehicle light 4 to the related vehicle.

For the purposes of this invention, the container body 8 can have any shape and size, as well as positioning: for example, the container body 8 may not be directly associated to the bodywork or to other hardware of the associable vehicle.

According to an embodiment, the container body 8 delimits a containment seat 12 that houses at least one light source 16 suitable to emit a light beam to be propagated outside of the vehicle light 4. For the purposes of this invention, the type of light source used is irrelevant; preferably, the light source 14 is a light emitting diode (LED) light source.

The container body 8 can house, in said containment seat 12, intermediate support elements 18 of various optical and/or electronic components inside the vehicle light 4, in a known manner.

The vehicle light 4 also comprises a lenticular body 20, at least partially counter-shaped with respect to the container body 8.

For example, the container body 8 is delimited by a first perimetral profile 24. The lenticular body 20 is in turn delimited by a second perimetral profile 28. The first and second perimetral profile 24, 28 are counter-shaped to each other so as to allow the coupling body of the lenticular body 20 on the container body 8.

The lenticular body 20 is then applied to the container body 8 so as to close said containment seat 12, which houses the at least one light source 16.

For the purposes of this invention, the lenticular body 20 can be outside, so as to define at least one outer wall of the vehicle light directly exposed to the atmosphere.

It is also possible that the lenticular body 20 be inside a motor vehicle, so as to be housed inside a passenger compartment of the motor vehicle; this is the case, for example, of a ceiling light or a part of a dashboard of a motor vehicle.

The lenticular body 20 closes the containment seat 12 and is suitable to transmit towards the outside of the vehicle light 4 the light beam produced by the main light source 16.

In this regard, the lenticular body 20 is made with material at least partially transparent, semi-transparent or translucent, also being able to include one or more opaque portions, so as, in any case, to allow the at least partial passage of a main light beam main emitted by said at least one main light source 16.

According to possible embodiments, the material of the lenticular body 20 is a resin such as PMMA, PC and the like.

The light 4 comprises a substrate 32 which supports said at least one main light source 16, on the side opposite the lenticular body 20, wherein the substrate 32 comprises an outer face 36 facing the lenticular body 20 and an inner face 40, opposite the outer face 36. The at least one main light source 16 is associated on the side of the inner face 40 of the substrate 32.

The at least one main light source 16 is embedded in a cover layer 44, in plastic, suitable to permit the diffusion of the main light beam inside it, wherein the cover layer 44 is placed opposite the lenticular body 20 with respect to the substrate 32.

The cover layer 44 acts substantially as a light guide in relation to the main light beam or beams emitted by the main light source 16.

The substrate 32 comprises at least one portion 48 transparent to the light beam suitable to transmit the main light beam towards the lenticular body 20 and, through this, outside the vehicle light 4.

Furthermore, the substrate 32 comprises at least one opaque portion 52 to the main beam, adjacent to said transparent portion 48.

Opaque portion 52 to the main light beam means a portion that does allow the main light beam to pass through, in order to form a screen or mask to the light beam itself.

In this way, the passage of the main light beam is exclusively allowed in correspondence of said at least one transparent portion 48 and, from this, the passage of the main light beam passes through the lenticular body 20.

The at least one transparent portion 48 defines a main light pattern of the vehicle light 4, visible from the outside of the light itself.

The transparent portions 48 and opaque portions 52 can be arranged with each other, interpenetrating in any way so as to create any type of main light pattern.

According to an embodiment, the substrate 32 is a sheet made of a material transparent to the beam of light emitted, and wherein said sheet is joined, on the outer face 36, to said at least one opaque portion 52.

Preferably, the substrate 32 is a flexible and/or thermoformable sheet. This makes it possible to adapt the substrate 32 to any geometry inside the vehicle light 4.

According to an embodiment, the at least one opaque portion 52 comprises a layer opaque to the main light beam, so as to prevent the crossing of said opaque portion 52 by the light beam emitted.

In one embodiment, the opaque portion 52 is placed at each main light source 16 in order to conceal the presence of the main light source 16 from outside the lenticular body 20.

According to a possible embodiment, the cover layer 44 comprises extractor or reflector elements 56 suitable to direct the main light beam incident upon them towards said at least one transparent portion 48.

For example, said extractor or reflector elements 56 are arranged on an end wall 60 of the cover layer 44 opposite the inner face 40 of the substrate 32.

According to an embodiment, the cover layer 44 is shaped so as to achieve a total internal reflection of the main light beam, except for the transparent portions 48.

In one embodiment, the inner face 40 of the substrate 32, except for said transparent portions 48, comprises reflective or diffusive surfaces 64 suitable to encourage the reflection/diffusion of the main light beam inside the cover layer 44.

The reflective or diffusive surfaces 64 can also be interspersed/alternated by opaque or absorbent surfaces 65 of the main light beam incident on them, in order to obtain particular optical effects.

Between the inner face 40 of the substrate 32 and each main light source 16 mechanical and electrical connection

68 of the light source 16 are arranged, suitable to mechanically fix the main light source 16 to the substrate 32 and to electrically connect the main light source 16 to an associable electricity supply of the light 4.

For example, the mechanical and electrical connection 68 of the main light source 16 comprise opaque, reflective portions and/or diffusive portions of the main light beam propagated inside the cover layer 44. In this way, even the mechanical and electrical connection 68 of the main light source 16 contribute to the diffusion/reflection of the main light beam inside the cover layer 44.

According to a possible embodiment, the main light sources 16 fixed to the substrate 32 are of the side-LED type, so as to emit main beams having a main optical axis substantially tangent to the corresponding portion of the inner face 40 of the substrate 32.

According to an embodiment, the cover layer 44 is fixed to the container body 8 and comprises at least one main light source 16 fixed on the inner face 40 of the substrate 32. Furthermore, the vehicle light 4 comprises at least one additional light source 72, facing the outer face 36 of the substrate 32 so as to emit an additional light beam incident on said outer face 36 of the substrate 32.

The outer face 36 of the substrate 32 in turn comprises reflective and/or diffusive portions 76 with respect to the additional light beam, to transmit the additional luminous beam towards the lenticular body 20.

It should be clarified that the definition of the main 16 and additional 72 light source, which emit the respective main and additional light beams, must not be understood as being linked to a kind of hierarchy between the light sources and corresponding light beams. These definitions are used simply to distinguish at least two different types of light beams and related light patterns emitted in output from the lenticular body 20.

Each light pattern typically serves to identify a specific signalling and/or illumination function of the vehicle light.

For example, the different light patterns can be used to realise the functions of position lights, brake lights and turn signals, but also back-up lights, depth lights, fog lights, rear fog lights and lights illuminating the license plate of a motor vehicle; in addition, said light patterns can also be used for applications inside the passenger compartment, such as ceiling lights or even for illumination of parts of the instrument panel or dashboard of a motor vehicle.

Preferably, the reflective and/or diffusive portions 76 with respect to the additional beam are arranged at said opaque portions 52 to the main light beam, so as to create an additional light pattern, at least partially complementary to the main light pattern coming from the adjacent transparent portions 48 of the substrate 32.

The reflective and/or diffusive portions 76 with respect to the additional light beam may also be interspersed/alternated by opaque or absorbent portions 77 of the additional light beam incident on them, in order to obtain particular optical effects of the additional light pattern, such as areas of light alternating with areas of shadow, or simply areas of light of different intensities.

The additional light source 72 can be of any type; for example, an LED source.

For example, the additional light source 72 is mechanically and electrically connected to a corresponding support base 78.

The reflective and/or diffusive portions 76 constitute not only a tool for directing the additional light beam towards the lenticular body 20, but also a tool for creating a precise aesthetic effect of said additional light beam.

In other words, the reflective and/or diffusive portions 76 are aesthetic portions that define the conformation of the additional pattern.

It is therefore possible to use specific surface treatments, silk-screening and similar treatments to achieve the desired graphic effect.

In one embodiment, the additional light source 72 is masked by a screen 80 so as not to be visible from outside the lenticular body 20.

The screen 80 can be for example a bulkhead of any shape and size so as to prevent seeing the additional light source 72 from outside of lenticular body 20. In this way the user does not see, from the outside, the light sources that emit the light beams inside the light 4 (both the main light beam and the additional light beam) but sees only the final effect, i.e., the light beams exiting the lenticular body in the form of the pre-established main and additional patterns.

In this way these light patterns are particularly homogeneous and uniform since the emission points of the light from the respective light sources are not visible.

Now, the method of making a vehicle light according to this invention will be described.

In particular, the method of making a vehicle light according to this invention comprises the steps of:
  preparing a container body 8 and a lenticular body 20 at least partially counter-shaped to each other,
  wherein the container body 8 delimits a containment seat 12 which houses at least one main light source 16 and the lenticular body 20 is applied to the container body 8 so as to close said containment seat 12, the lenticular body being made in transparent material to a main light beam emitted by said at least one main light source 16,
  preparing a substrate 32 which supports the at least one main light source 16, on the side opposite the lenticular body 20, the substrate 32 comprising an outer face 36 facing the lenticular body 20 and an inner face 40, opposite the outer face 36, said at least one main light source being associated on the side of the inner face 40 of the substrate 32,
  embedding the at least one main light source 16 in a cover layer 44, in plastic, suitable to permit the diffusion of the main light beam inside it, the cover layer 44 being placed opposite the lenticular body 20 with respect to the substrate 32,
  wherein the substrate 32 comprises at least one portion 48 transparent to the light beam suitable to transmit the main light beam towards the lenticular body 20 and, through this, outside the vehicle light 4,
  wherein the substrate 32 comprises at least one opaque portion 52 to the main light beam, adjacent to said transparent portion 48 in order to allow the passage of the main light beam exclusively at said transparent portion 48, the at least one transparent portion 48 defining a main light pattern of the vehicle light 4.

Figure 1:
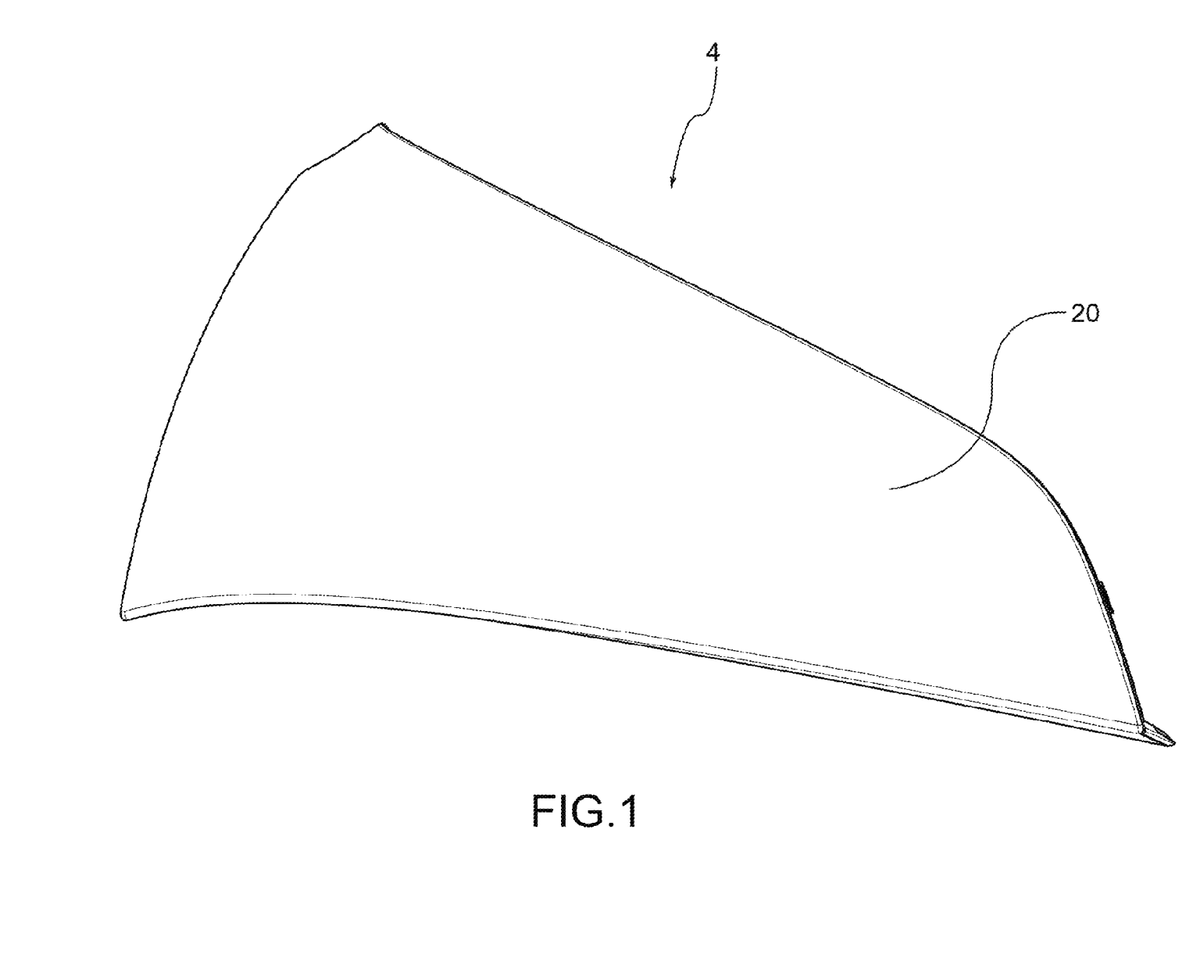
FIG. 1 is a perspective view, from the front, of a vehicle light according to this invention.
Figure 2:
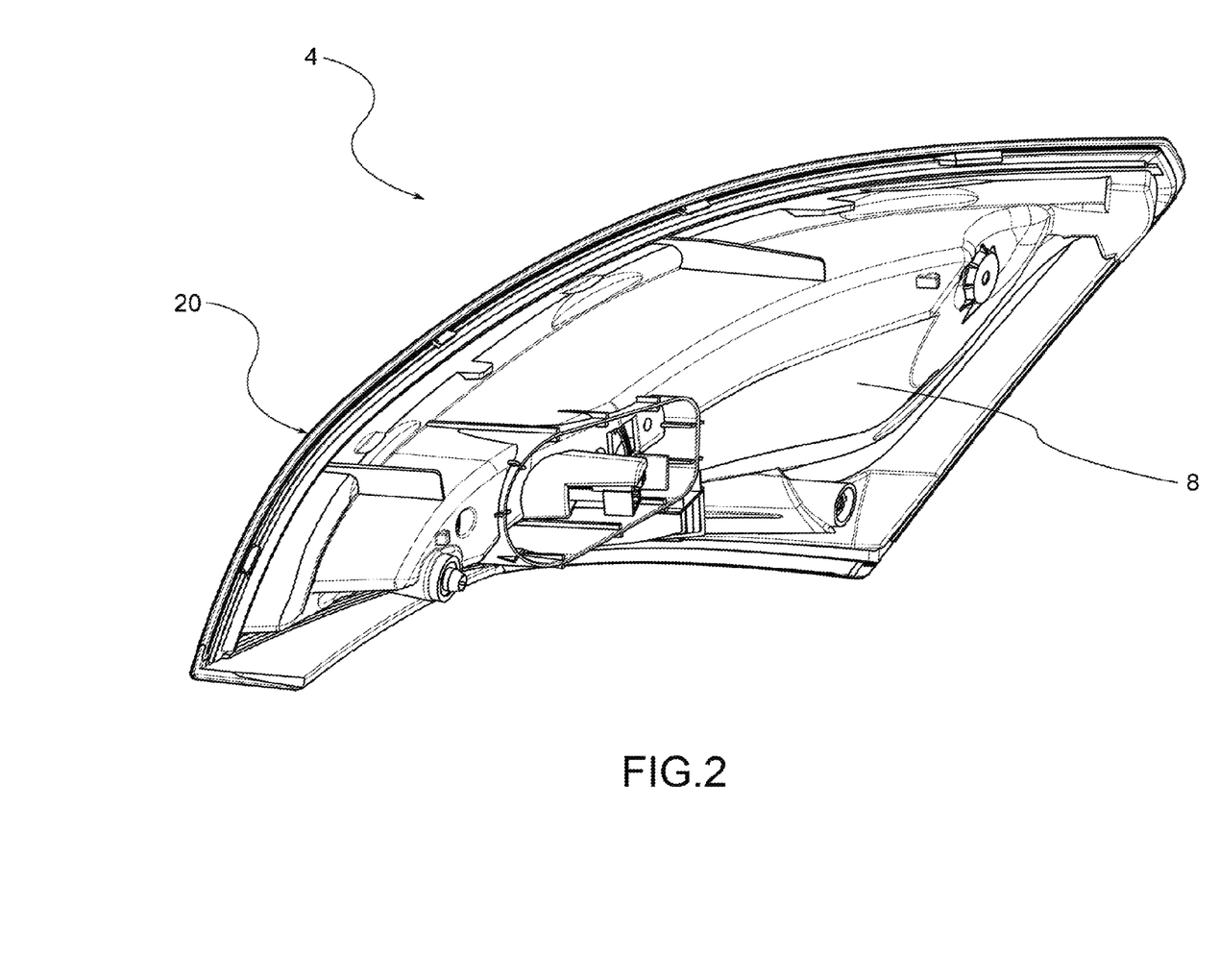
FIG. 2 is a perspective view, from the rear, of the vehicle light of FIG. 1.
Figure 3:
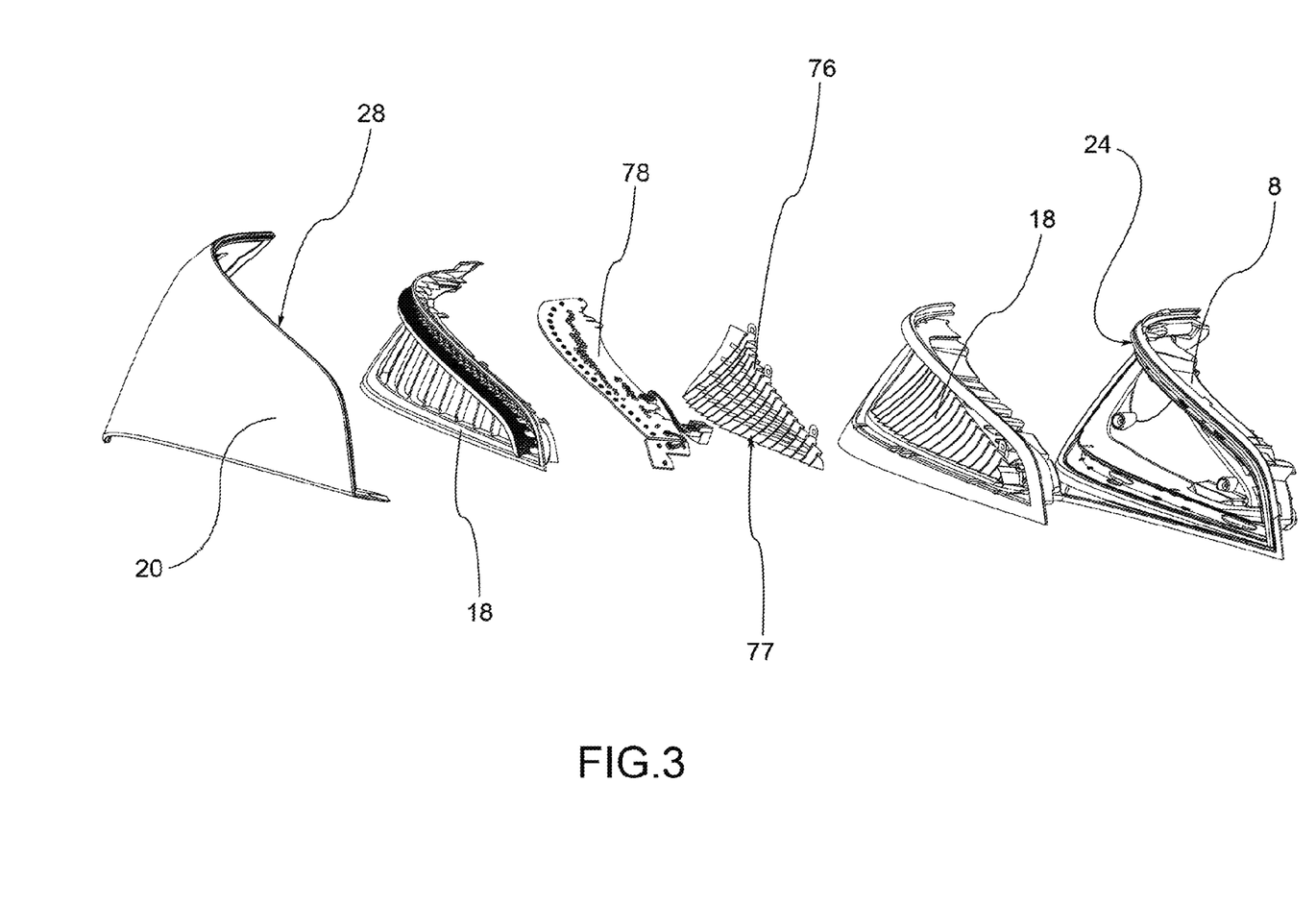
FIG. 3 is a perspective view, in separate parts, of the vehicle light of FIG. 1.
Figure 4:
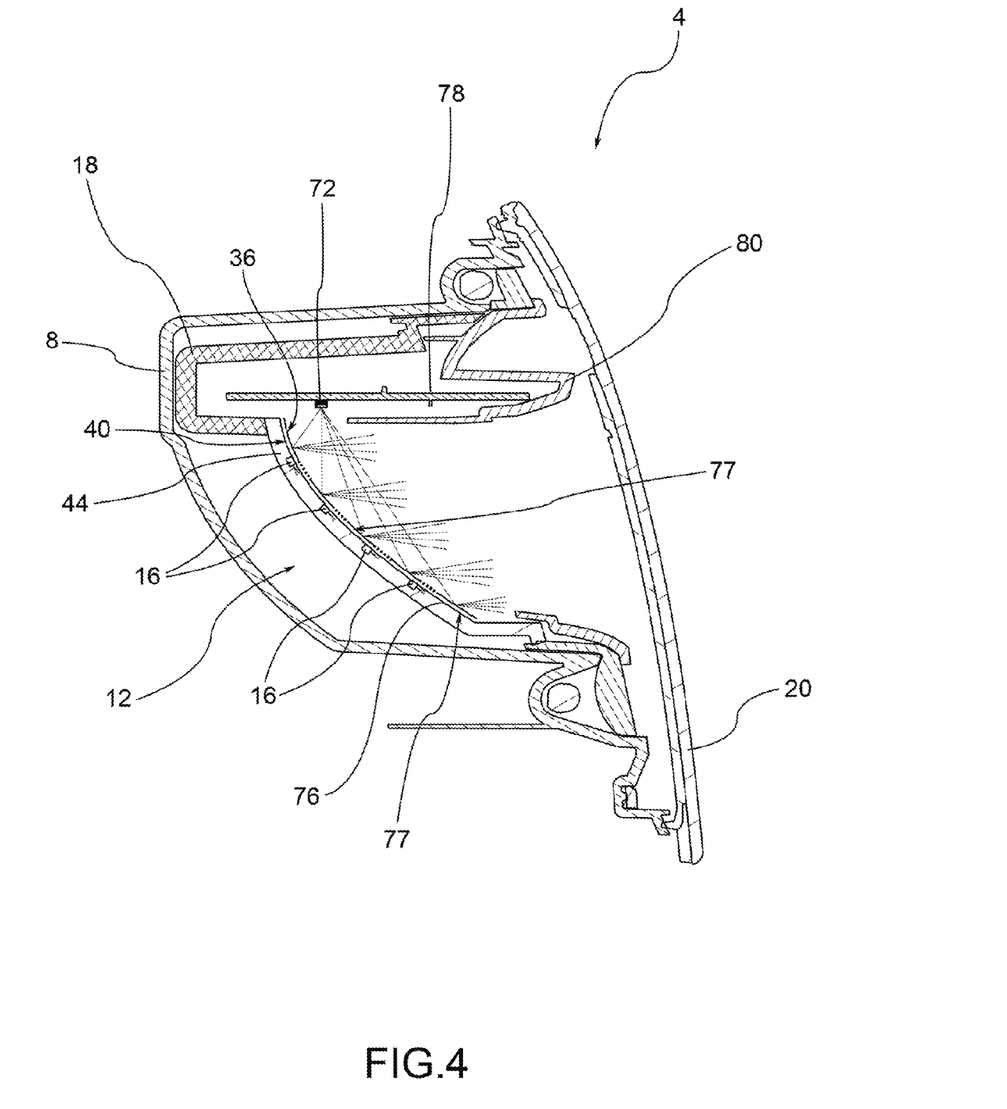
FIG. 4 is a sectional view of a light according to an embodiment of this invention.
Figure 5:
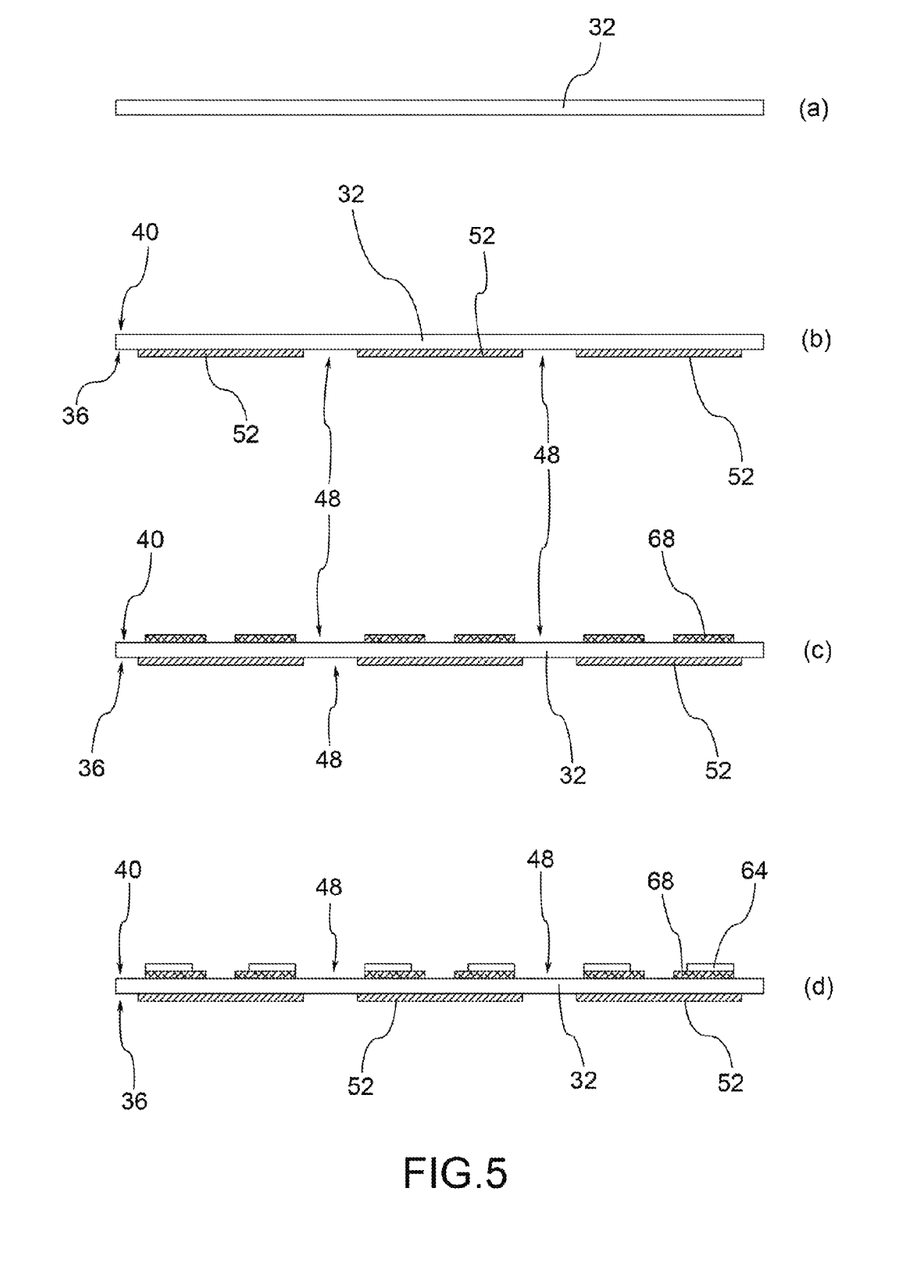
FIG. 5 is a schematic view, in sequence, of the assembly steps of components of a light according to this invention.
Figure 6:
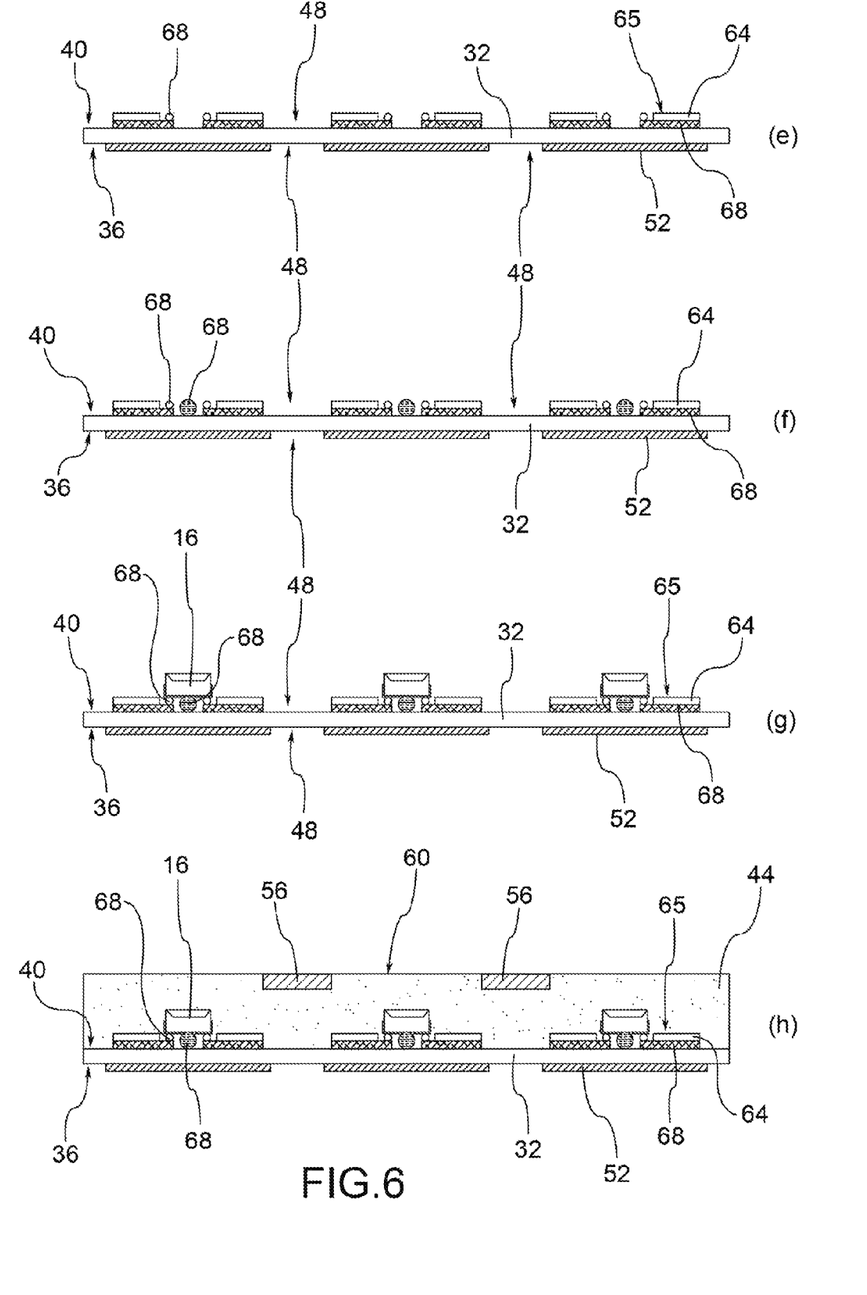
FIG. 6 is a schematic view, in sequence, of the assembly steps of components of a light according to this invention.

Some assembly stages of a vehicle light according to this invention are schematised in FIGS. 5 to 6.

In particular, FIG. 5a illustrates the substrate 32 on which the opaque portions 52 (FIG. 5b) are applied, as well as the reflective or diffusive surfaces 64, and the mechanical and electrical connection 68 (FIGS. 5c-5d), such as for example electrically conductive layers for powering the main light source 16.

Then one proceeds, always with the deposition of said mechanical and electrical connection 68, such as, for example, a conductive adhesive or a soldering paste (FIG. 6e), and a structural adhesive (FIG. 6f) for the subsequent fixing of the main light source 16 (FIG. 6g).

Finally, the assembly is embedded in the cover layer 44 (FIG. 6h).

As can be appreciated from the description, this invention allows overcoming the drawbacks presented in the prior art.

In particular, the light according to this invention allows obtaining any predefined light pattern and meeting all photometric specifications of the light.

The pattern is obtained in a clear manner and it is clearly distinguishable from the outside of the light.

Furthermore, it is also possible to cross one or more light patterns, for example used for different lighting functions, and overlapping them at least partially while still maintaining a clear distinguishability between them.

The light patterns also have a significant uniformity and homogeneity of the light beam diffused outside the vehicle light.

Therefore, thanks to this invention it is possible to obtain any light pattern, i.e., having any geometric shape, while maintaining a high energy efficiency and lighting homogeneity of the pattern itself.

Moreover, it is possible to have a plurality of light patterns, partially or totally overlapping one another while maintaining a clear distinguishability between them if they are lit at the same time.

The invention has been described in an illustrative manner. It is to be understood that the terminology which has been used is intended to be in the nature of words of description rather than of limitation. Many modifications and variations of the invention are possible in light of the above teachings. Therefore, within the scope of the appended claims, the invention may be practiced other than as specifically described.

The invention claimed is:

1. A vehicle light comprising:
   a container body and a lenticular body at least partially counter-shaped to each other,
   wherein the container body delimits a containment seat which houses at least one main light source and the lenticular body is applied to the container body so as to close said containment seat, the lenticular body being made in transparent or semi-transparent or translucent material to a main light beam emitted by said at least one main light source,
   wherein the light comprises a substrate which supports said at least one main light source, on the side opposite the lenticular body, the substrate comprising an outer face facing the lenticular body and an inner face, opposite the outer face, said at least one main light source being associated on the side of the inner face of the substrate,
   wherein said at least one main light source is embedded in a cover layer, in plastic, suitable to permit the diffusion of the main light beam inside it, the cover layer being placed opposite the lenticular body with respect to the substrate,
   wherein the substrate comprises at least one portion transparent to the light beam suitable to transmit the main light beam towards the lenticular body and, through this, outside the vehicle light,
   wherein the substrate comprises at least one opaque portion to the main light beam, adjacent to said transparent portion in order to allow the passage of the main light beam exclusively at said transparent portion, the at least one transparent portion defining a main light pattern of the vehicle light.

2. The vehicle light as set forth in claim 1, wherein substrate is a sheet made of a transparent material to the beam of light emitted, and wherein said sheet is joined, on the outer face, to said at least one opaque portion.

3. The vehicle light as set forth in claim 1, where said substrate is a flexible and/or thermoformable sheet.

4. The vehicle light as set forth in claim 1, wherein said at least one opaque portion comprises a layer opaque to the main light beam, so as to prevent the crossing of said opaque portion by the light beam emitted.

5. The vehicle light as set forth in claim 1, wherein said opaque portion is placed at each main light source in order to conceal the presence of the main light source from outside the lenticular body.

6. The vehicle light as set forth in claim 1, wherein the cover layer comprises extractor or reflector elements suitable to direct the main light beam incident upon them towards said at least one transparent portion.

7. The vehicle light as set forth in claim 6, wherein said extractor or reflector elements are arranged on an end wall of the cover layer opposite the inner face of the substrate.

8. The vehicle light as set forth in claim 1, wherein the cover layer is shaped so as to achieve a total internal reflection of the main light beam, except for the transparent portions.

9. The vehicle light as set forth in claim 1, wherein the inner face of the substrate, except for said transparent portions, comprises reflective or diffusive surfaces suitable to encourage the reflection/diffusion of the main light beam inside the cover layer.

10. The vehicle light as set forth in claim 1, wherein between the inner face of the substrate and each main light source mechanical and electrical connection of the light source are arranged, suitable to mechanically fix the main light source to the substrate and to electrically connect the main light source to an associable electricity supply of the light.

11. The vehicle light as set forth in claim 10, wherein said mechanical and electrical connection of the main light source comprise opaque, reflective portions and/or diffusive portions of the main light beam propagated inside the cover layer.

12. The vehicle light as set forth in claim 1, wherein such main light sources fixed to the substrate are of the side-LED type, so as to emit a main light beam having a main optical axis substantially tangent to the corresponding portion of the inner face of the substrate.

13. The vehicle light as set forth in claim 1, wherein the cover layer is fixed to the container body and comprises at least one main light source fixed to the inner face of the substrate, and wherein the light comprises at least one additional light source, facing the outer face of the substrate so as to emit an additional light beam incident on said outer face of the substrate, the outer face comprising reflective and/or diffusive portions with respect to the additional light beam to transmit the additional light beam towards the lenticular body.

14. The vehicle light as set forth in claim 13, wherein said reflective and/or diffusive portions with respect to the additional beam are arranged at said opaque portions to the main light beam, so as to create an additional light pattern, at least partially complementary to the main light pattern coming from the adjacent transparent portions of the substrate.

15. The vehicle light as set forth in claim 13, wherein said reflective and/or diffusive portions with respect to the additional beam are interspersed/alternated by opaque or absorbent portions of the additional light beam incident on them.

16. The vehicle light as set forth in claim 13, wherein said additional light source is a LED source.

17. The vehicle light as set forth in claim 13, wherein said additional light source is masked by a screen so as not to be visible from outside the lenticular body.

18. A method of manufacturing an automotive headlight comprising the steps of:

preparing a container body and a lenticular body at least partially counter-shaped to each other, wherein the container body delimits a containment seat which houses at least one main light source and the lenticular body is applied to the container body so as to close said containment seat, the lenticular body being made in transparent material to a main light beam emitted by said at least one main light source, preparing a substrate which supports said at least one main light source, on the side opposite the lenticular body, the substrate comprising an outer face facing the lenticular body and an inner face, opposite the outer face, said at least one main light source being associated on the side of the inner face of the substrate, embedding said at least one main light source in a cover layer in plastic, suitable to permit the diffusion of the main light beam inside it, the cover layer being placed opposite the lenticular body with respect to the substrate, wherein the substrate comprises at least one portion transparent to the light beam suitable to transmit the main light beam towards the lenticular body and, through this, outside the vehicle light, wherein the substrate comprises at least one opaque portion to the main light beam, adjacent to said transparent portion in order to allow the passage of the main light beam exclusively at said transparent portion, the at least one transparent portion defining a main light pattern of the vehicle light.

\* \* \* \* \*